(12) United States Patent
Rapales et al.

(10) Patent No.: US 9,468,107 B2
(45) Date of Patent: Oct. 11, 2016

(54) INTERDIGITATED CHIP CAPACITOR ASSEMBLY

(71) Applicant: Texas Instruments Incorporated, Dallas, TX (US)

(72) Inventors: Allan Jerome Daen Rapales, Baguio (PH); Floro Lopez Camenforte, III, Baguio (PH); John Paul Quianzon Kwo, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/695,216

(22) Filed: Apr. 24, 2015

(65) Prior Publication Data

US 2015/0230345 A1 Aug. 13, 2015

Related U.S. Application Data

(62) Division of application No. 13/767,009, filed on Feb. 14, 2013, now Pat. No. 9,039,427.

(51) Int. Cl.
| | |
|---|---|
| *H05K 3/34* | (2006.01) |
| *H01G 2/06* | (2006.01) |
| *H01G 4/232* | (2006.01) |

(Continued)

(52) U.S. Cl.
CPC ............ *H05K 3/3442* (2013.01); *H01G 2/065* (2013.01); *H01G 4/232* (2013.01); *H05K 1/18* (2013.01); *H05K 1/183* (2013.01); *H05K 3/0014* (2013.01); *H05K 3/301* (2013.01); *H05K 3/3452* (2013.01); *H01G 4/30* (2013.01); *H05K 2201/0162* (2013.01); *H05K 2201/09036* (2013.01); *H05K 2201/09172* (2013.01); *H05K 2201/09909* (2013.01); *H05K 2203/0126* (2013.01); *H05K 2203/046* (2013.01); *H05K 2203/167* (2013.01); *H05K 2203/168* (2013.01); *Y02P 70/613* (2015.11); *Y10T 29/43* (2015.01); *Y10T 29/49135* (2015.01)

(58) Field of Classification Search
CPC .. H01R 12/712; H01R 12/716; H01R 12/721; H01R 12/722; H01R 12/724; H01R 12/57; H01R 12/7076
See application file for complete search history.

(56) References Cited

U.S. PATENT DOCUMENTS

| | | | | |
|---|---|---|---|---|
| 5,282,759 | A * | 2/1994 | Sakamoto | H01R 13/7195 333/185 |
| 6,291,893 | B1 * | 9/2001 | Tiziani | H01L 23/3121 257/706 |

(Continued)

*Primary Examiner* — Truc Nguyen
(74) *Attorney, Agent, or Firm* — John R. Pessetto; Frank D. Cimino (57) ABSTRACT

A method of registering terminals on an interdigitated chip capacitor ("IDC") with a plurality of contact pads on a substrate. At least one vertically extending nonconductive abutment surface is formed between adjacent ones of the contact pads. A plurality of grooves projecting outwardly from said a central recess is formed on the substrate top portion. At least one sidewall portion of the IDC is urged into abutting engagement with the at least one abutment surface on the substrate. Another method prevent solder from causing short circuits between adjacent terminals. A plurality of grooves extending laterally outwardly from a central recessed portion are formed. The plurality of grooves defining a plurality of inwardly projecting fingers. A plurality of contact pads on are formed on a respective plurality of fingers. A solder bead is formed on at least some of the plurality of contact pads. The at least one solder bead is isolated from adjacent solder beads and adjacent terminals.

13 Claims, 10 Drawing Sheets

(51) Int. Cl.
*H05K 1/18* (2006.01)
*H05K 3/00* (2006.01)
*H05K 3/30* (2006.01)
*H01G 4/30* (2006.01)

(56) References Cited

U.S. PATENT DOCUMENTS 6,407,566 B1 * 6/2002 Brunelle ............... G01R 1/0408
 324/756.02
8,018,731 B2 * 9/2011 Sakurai .................. H01L 23/13
 361/728
2001/0053567 A1 * 12/2001 Akram ................ G01R 1/0483
 438/127
2015/0235914 A1 * 8/2015 Lin .......................... H01L 24/17
 257/737
2016/0007485 A1 * 1/2016 Hartmann ............. H05K 3/301
 361/752

* cited by examiner

INTERDIGITATED CHIP CAPACITOR ASSEMBLY

CROSS-REFERENCE TO RELATED APPLICATION

This application is a Continuation of and claims priority to U.S. patent application Ser. No. 13/767,009 filed on Feb. 14, 2013. Said application incorporated herein by reference.

BACKGROUND

Interdigitated chip capacitors, also referred to simply as "interdigitated capacitors" or "IDCs," are surface mount, passive circuit devices. IDCs may be mounted on different substrates, including ceramic and organic substrates. These devices typically have a rectangular block-like shape with flat top and bottom portions and four flat sidewall portions. IDC terminals or "lands," in a typical embodiment, are elongated strips of solder that are positioned in spaced apart relationship on the IDC sidewalls. These terminals typically extend from the bottom portion to the top portion of the IDC. A generally flat exterior surface of each terminal may be more or less flush with the sidewall on which it is located.

An electric substrate on which an IDC with sidewall terminals is to be mounted is provided with a plurality of contact pads on its top surface. These substrate contact pads are arranged in a rectangular pattern that corresponds to the pattern of the terminals on the IDC. The contact pads on the substrate are initially coated with solder paste, usually by screen printing. Next, the IDC is placed on the substrate, as by use of a pick-and-place machine. The bottom ends of the IDC terminals contact the solder paste on the substrate contact pads. The substrate and IDC are then placed in a reflow oven where the solder of the IDC terminals and the solder paste on the substrate contacts are reflowed (melted) to solder bond the IDC terminals to the substrate contact pads.

DETAILED DESCRIPTION

Figure 3:
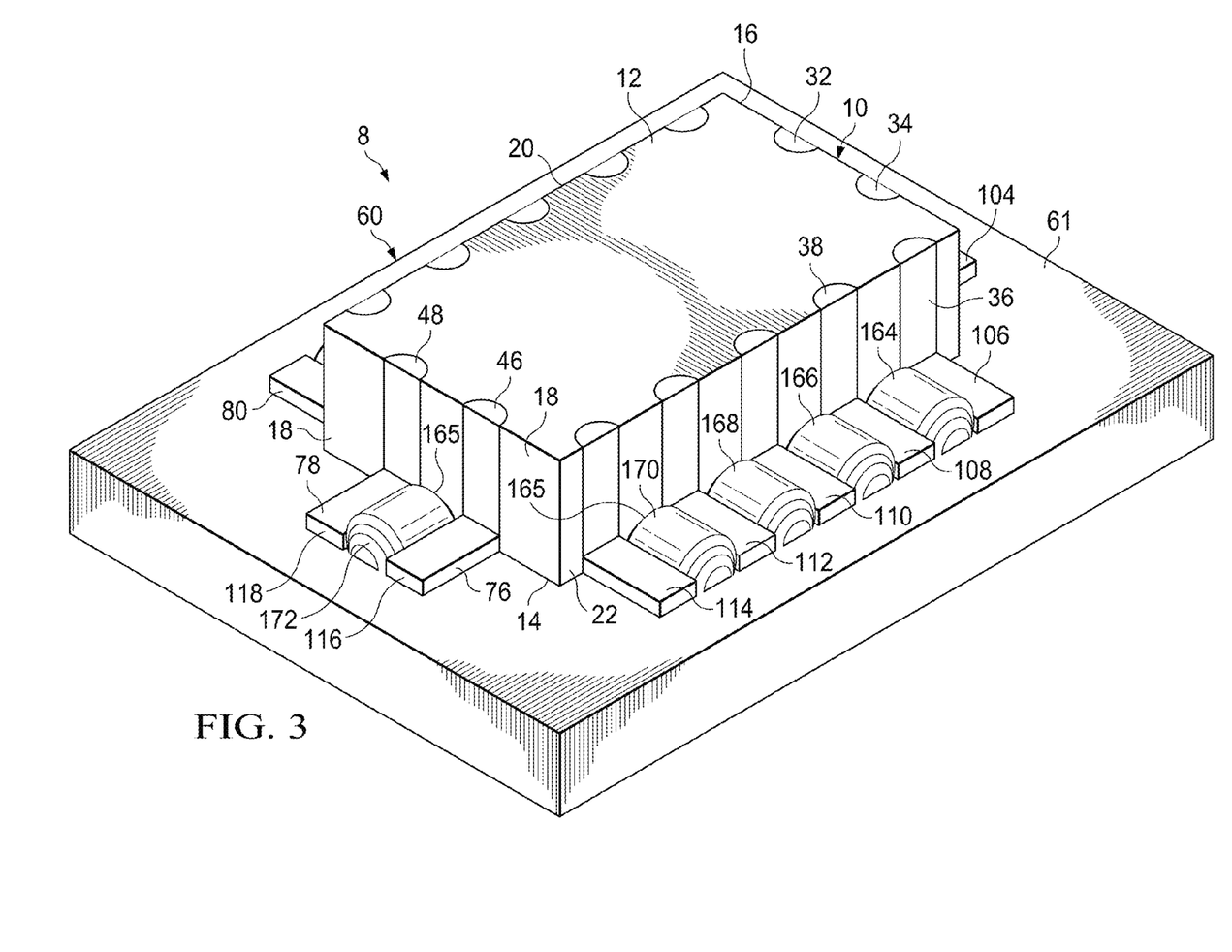
FIG. 3 is a schematic isometric view of an IDC mounted on an electrical substrate with dams positioned between solder strips covering substrate contact pads.

In general, this specification discloses an interdigitated chip capacitor ("IDC") assembly 8, FIG. 3. The assembly 8 includes an IDC 10 with a top portion 12, a bottom portion 14 opposite the top portion 12, a plurality of sidewall portions 16, 18, 20, 22 [these are referred to as end portions and side portions later in the description] extending between the top and bottom portions 12, 14. A plurality of terminals 32, 34, 36, etc., are located on the sidewall portions 16, 18, 20, 22. The assembly 8 also includes a substrate 60 having a top portion 61 with a plurality of generally flat, vertically extending abutment surfaces 165 (FIG. 3), 215 (FIG. 7), etc. thereon, the sidewall portions 16, 18, 20, 22 of the IDC 10 abuttingly engage at least some of the plurality of abutment surfaces 165, FIG. 3-6, or 215, etc., FIG. 7.

Having thus generally described an IDC assembly 8, such assembly and methods of making it and variations thereof will now be described in further detail.

Figure 1:
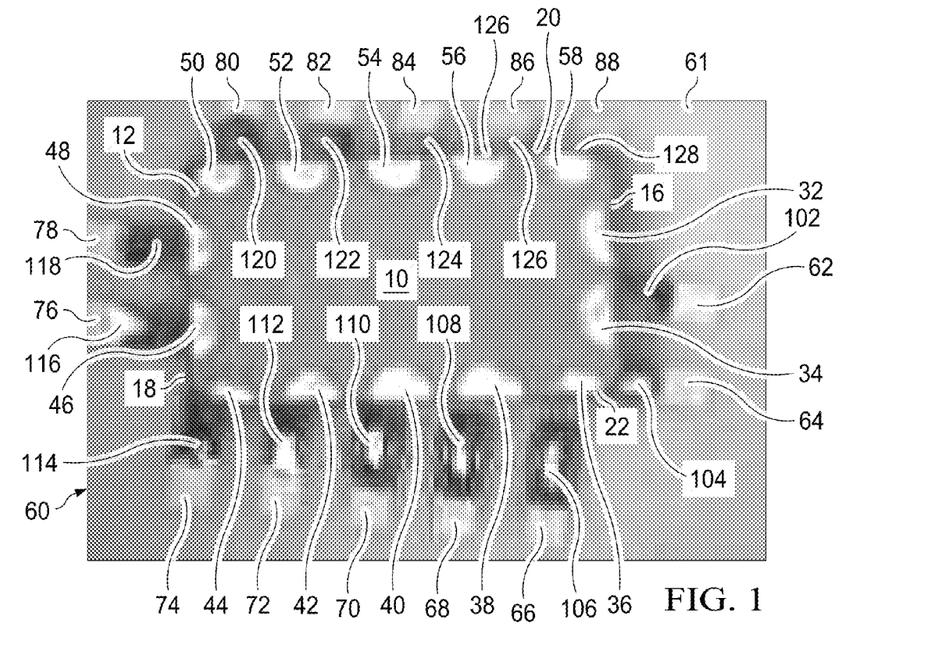
FIG. 1 is a photograph, taken from a top perspective, of an IDC mounted on an electrical substrate.

FIG. 1 is a photograph taken from a top perspective of an interdigitated chip capacitor ("IDC") 10 mounted on an electrical substrate 60 in misaligned relationship therewith. The IDC 10 has a rectangular block-like shape with generally flat top and bottom portions 12, 14. The IDC 10 has generally flat first and second end portions 16, 18 and generally flat first side and second lateral side portions 20, 22, which are referred to collectively herein as sidewall portions 16, 18, 20, 22. Mounted in spaced apart relationship on the sidewall portions 16, 18, 20, 22 are a plurality of IDC terminals 32, 34, 36, 38, 40, 42, 44, 46, 48, 50, 52, 54, 56, 58 that extend from the top portion 12 to the bottom portion 14 of the IDC 10.

Substrate 60, as further shown in FIG. 1, has a flat top surface 61 upon which is arranged a plurality of substrate contact pads 62, 64, 66, 68, 70, 72, 74, 76, 78, 80, 82, 84, 86, 88. The contact pads 62, 64, etc., which may be formed from copper or other conductive metal, are arranged in a rectangular pattern with an inner periphery corresponding to the outer periphery of the IDC 10. The contact pads 62, 64, etc., are configured to be aligned with corresponding IDC terminals 32, 34, etc.

As also illustrated by FIG. 1, a solder bead (also referred to herein as "solder strip") 102, 104, 106, 108, 110, 112, 114, 116, 118, 120, 122, 124, 126, 128 is positioned on top of each substrate contact pad 62, 64, etc. The solder beads 102, 104, etc. are formed from solder paste (not shown) which is initially applied to the contact pads 62, 64, etc. and which is subsequently reflowed to provide the solder beads 102, etc., shown in the photograph of FIG. 1. In an ideal position, the IDC terminals 32, etc., would each be positioned directly opposite corresponding substrate contact pads 62, etc., and the solder beads 102, etc., located on each contact pad 62, 64, etc., would contact only the aligned IDC terminals 32, etc. In the photograph of FIG. 1, the position of the IDC 10 is somewhat twisted from this ideal location.

Figure 2:
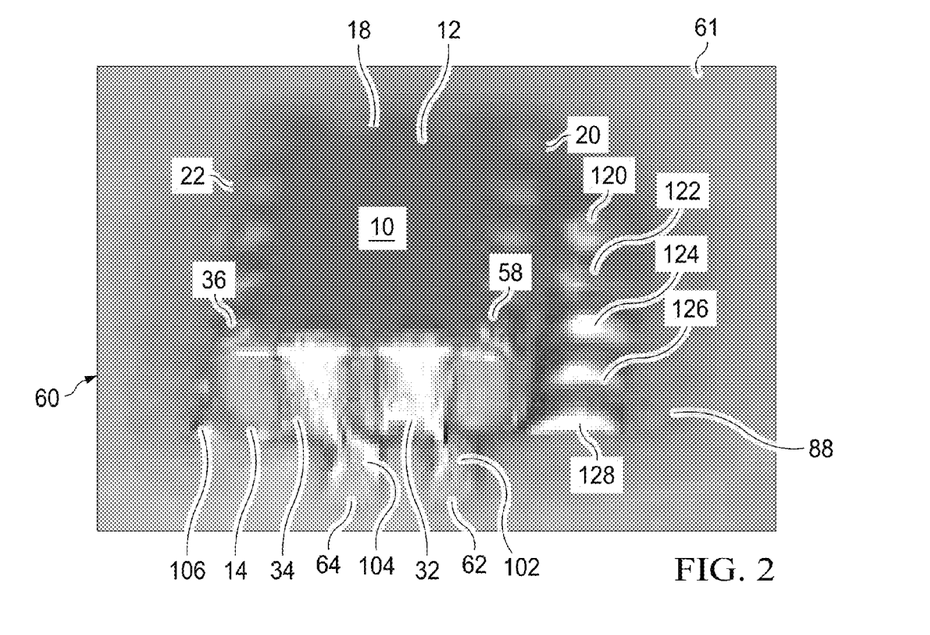
FIG. 2 is a photograph, taken from a top front perspective, of another IDC mounted on an electrical substrate.

FIG. 2 is a photograph of a different IDC/substrate mounting attempt from that shown in FIG. 1. The IDC 10 and the substrate 60 shown in the FIG. 2 photograph are substantially identical to those shown in the FIG. 1 photograph, but the misalignment between IDC 10 and substrate 60 is somewhat different in the two photographs. The same reference numerals for the various parts that are used in FIG. 1 are also used in FIG. 2.

Applicants have discovered that misalignments between IDC 10 and substrate 60 may be caused by initial inaccurate placement of the IDC 10 on the substrate 60, or may be caused by shifting movement of the IDC 10 during movement of the substrate to the reflow oven, or may be caused by "floating" of the IDC 10 on molten solder during reflow heating, or may be due to other causes. Various defects associated with misalignment are shown in these FIGS. 1 and 2 photographs. For example in FIG. 1, solder beads 106, 108 near lateral sidewall portion 22 of the IDC 10 do not make contact with the corresponding IDC terminals 36, 38. Also, on the opposite lateral side sidewall portion 20, the IDC 10 rests on top the solder beads 126, 128 associated with contact pads 86 and 88 so that the corresponding IDC terminals 56, 58 make little or no contact with the solder beads 126, 128. In FIG. 2, it appears that the solder bead 104 on contact pad 64 is so misaligned with associated terminal 34 that it contacts both terminals 32 and 34. Also the IDC 10 is shifted so far to the left side in FIG. 2 that the IDC terminals on the left side 22 are positioned above, not beside, the associated solder beads, and the solder beads 122, 124, 126, 128 associated with IDC sidewall portion 20 do not make contact with the associated IDC terminals. It will be appreciated by those skilled in the art that any such gap between solder beads and IDC terminals will result in an open circuit and any situation wherein a solder bead contacts two terminals or an adjacent solder bead will result in a short circuit. In any of these situations the IDC 10 will malfunction.

Figure 4:
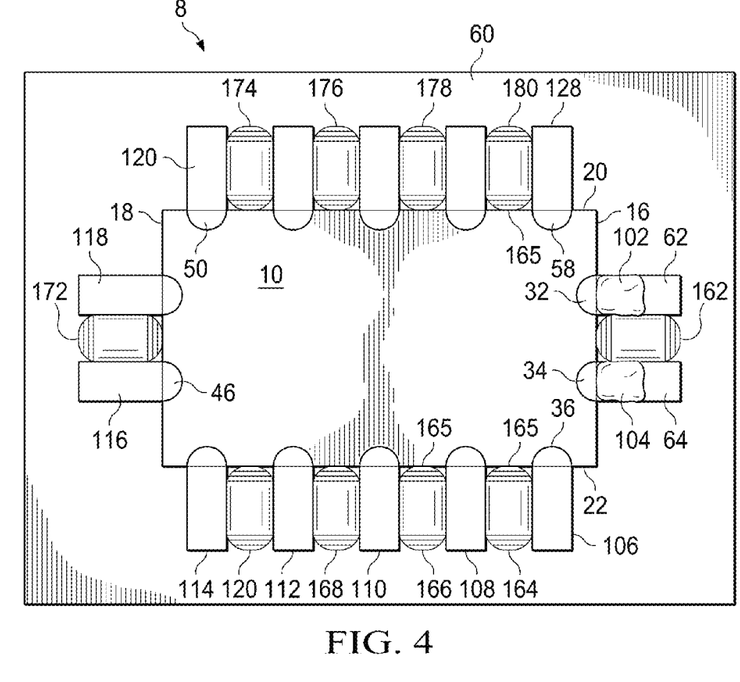
FIG. 4 is a schematic top plan view of the IDC and substrate of FIG. 3.
Figure 5:
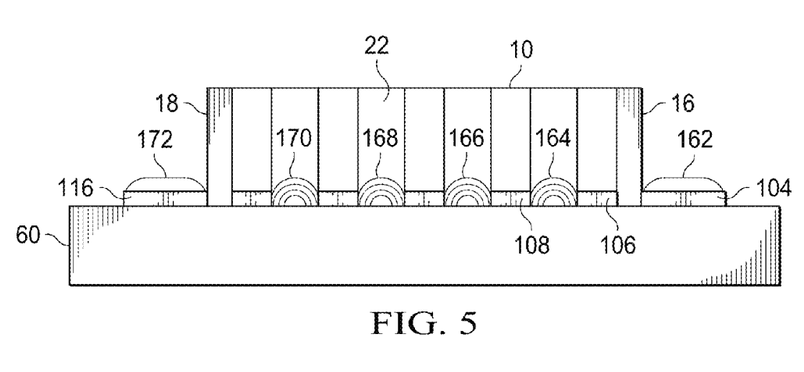
FIG. 5 is a schematic side elevation view of the IDC and substrate of FIG. 3.
Figure 6:
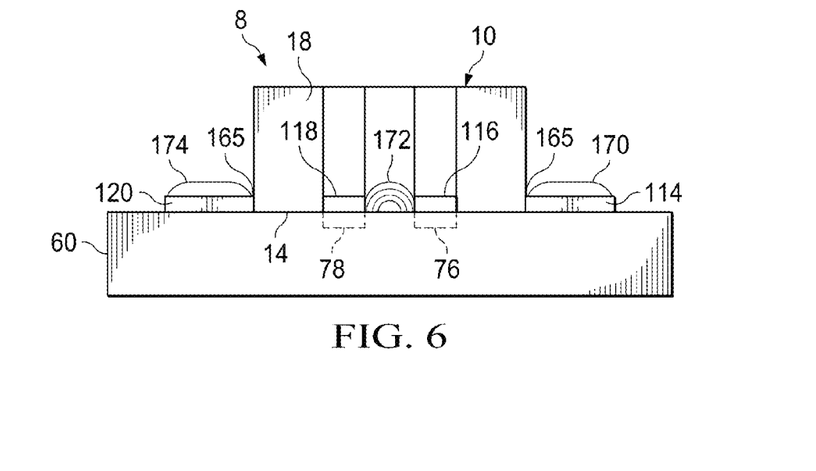
FIG. 6 is a schematic end elevation view of the IDC and substrate of FIG. 3.
Figure 7:
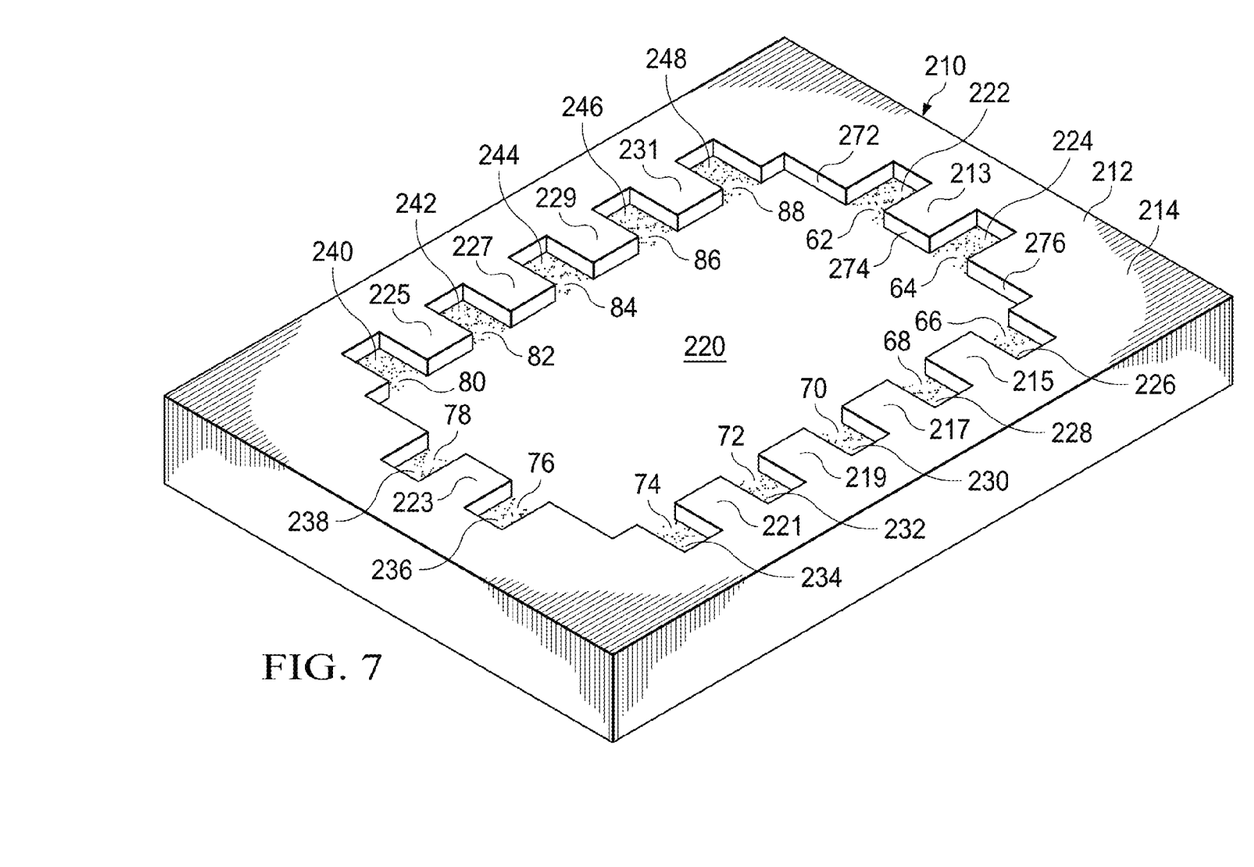
FIG. 7 is a schematic isometric view of an electrical substrate having a plurality of recessed portions thereon.
Figure 8:
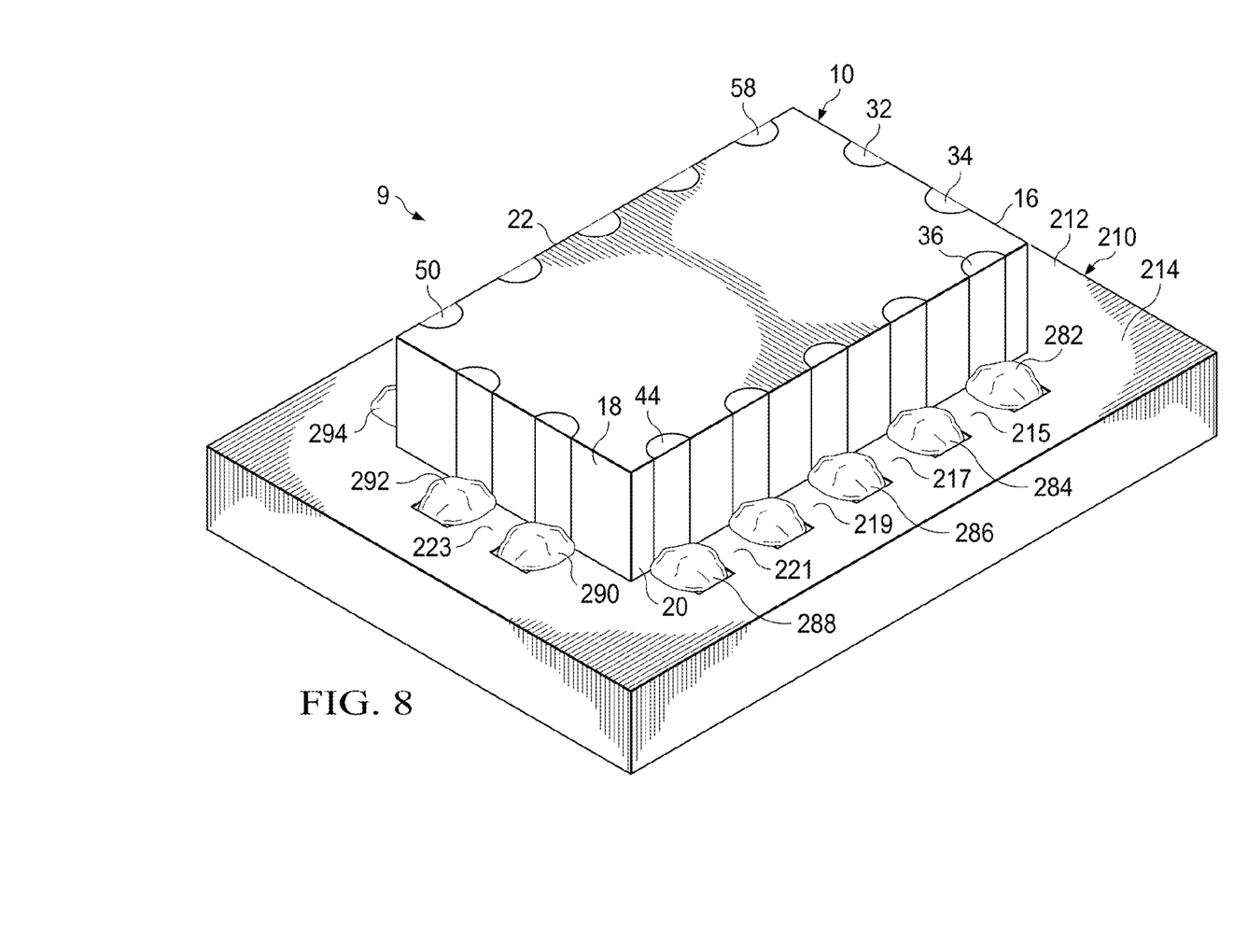
FIG. 8 is a schematic isometric view of the substrate of FIG. 7 with an IDC mounted thereon.

Applicants solution to the problems associated with the photographs of FIG. 1 and FIG. 2 are illustrated in FIGS. 3-8. FIGS. 3-5 use the same reference numerals to indicate the various parts of the IDC 10 and substrate 60 as are used in FIGS. 1 and 2. In FIGS. 7 and 8 the structure of the substrate is different and different reference numerals are used with the substrate, although the IDC 10 is described with the same reference numerals as used with FIGS. 1-5.

Referring to FIGS. 3-6, it will be seen that on each side of the IDC 10 a dam 162, 164, 166, . . . 178, 180, is placed between each adjacent pair of substrate contact pads, e.g., 62, 64, FIG. 4, and the beads 102, 104, etc., associated with these contact pads. Each dam 162, 164, etc., may have a height greater than the height of the adjacent solder bead 102, 104, etc., and may be substantially coextensive with the solder beads 102, 104, etc. In one embodiment, each dam 162, 164, etc. is two to three times the height of the adjacent solder beads 102, 104, etc. Various techniques may be used for providing the dams 162, 164, etc. The dams 162, 164, etc. are constructed from a nonconductive material such as, for example, solder resist or silicon. The dams 162, 164, etc., may be formed by dispensing a nonconductive, highly viscous material, such as a silicone material, in between adjacent substrate contact pads 62, 64, etc., or alternatively could be provided by screen printing of such material prior to applying the solder paste to the contact pads 62, 64, etc. The material used to form the dams 162, etc., may be cured along with the solder paste during reflow heating. The dams 162, etc., in one embodiment, have a height of around 200 μm to 300 μm and the solder paste height is around 90 μm. One purpose of the dams 162, etc., is to prevent adjacent solder beads 102, 104, etc., from flowing together or flowing into contact with more than one terminal 32, 34, etc., on the IDC 10. Another purpose of the dams 162, etc., is to hold the IDC 10 at a desired location with respect to the substrate 60 contact pads 62, 64, etc., by providing relatively tall abutment surfaces against which the sidewall portions ["portions" is not used above, except for the first paragraph] 16, 18, 20, 22 of the IDC 10 can make abutting and aligning contact.

FIGS. 7 and 8 illustrate a manner of placing the IDC 10 in proper registration with a substrate 210 and of separating the solder beads 282, 284, etc., so that each bead makes contact only with its corresponding terminal 36, etc., on the IDC 10 and so that the solder beads 282, 284, etc., never make shorting contact one another. As best illustrated by FIG. 7, an electrical substrate 210 has a top portion 212 with a flat upper surface 214. A large central recess portion 220 having the same footprint as the IDC 10 is formed on the top portion 212. The central recess portion 220 has a plurality of smaller recessed portions or slots 222, 224, 226, 228 . . . 248 that extend outwardly therefrom. A substrate contact pad 62, 64, etc. may be located at the horizontal surface, i.e. the bottom, of each slot 222, 224, etc. and may be substantially the same length and width as the associated slot. The voids provided by the large central recessed portion 220 and the outwardly projecting slots 222, 224, etc., define a plurality of generally rectangular shaped, spaced apart, riser portions 213, 215, 217, . . . 229, 231. The central recessed portion 220 and slots 222, 224, etc., define a plurality of vertical wall surfaces 272, 274, 276, etc. that lie about the perimeter of the central recessed portion 220. These vertical wall surfaces 272, 274, 276, etc., provide abutment surfaces against which the sidewalls 16, 18, 20, 22 of the IDC 10 make abutting contact to place the terminals 32, 34, etc. of the IDC 10 in proper alignment with the contact pads 62, etc. and associated solder beads (described below) on the substrate 210. The depth of the large central recessed portion 220 and the depth of each of the outwardly projecting slots 222, etc. may be the same and may, in one embodiment, be about one third the thickness (height) of the IDC 10 that is to be mounted on the substrate 210. In other embodiments the depths of the central recess portion 220 and the slots 222, etc. may be different from one another and may be greater or less than one third the thickness (height) of the IDC 10.

As illustrated in FIG. 8, a solder bead 282, 284, 286, etc., is formed on each contact pad 62, 64, etc., to connect each contact pad to an associated terminal 32, 34, etc., on the IDC 10. The solder beads 282, 284, etc., in the embodiment shown in FIG. 8 extend somewhat higher than the flat upper surface 214 of the substrate 210. In other embodiments the solder beads 282, etc., do not extend as high as the flat upper surface 214. The solder beads 282, etc., are formed by reflowing of solder paste that is dispensed into the slots 222, 224, etc.

In both the IDC assembly 8 of FIGS. 3-6 and the IDC assembly 9 of FIGS. 7 and 8, at least two of the sidewalls 16, 18, 20, 22 of the IDC 10 engage abutment surfaces that have a fixed relationship with the contact pads 62, 64, etc. on the substrate 60 or 210. This engagement provides proper registration between the terminals 32, 34, etc., on the IDC 10 and the substrate contact pads 62, 64, etc. The disclosed structures that provide the abutment surfaces on the substrate 60 or 210 also serves to contain the solder beads 102, 104 or 282, 284, etc., and limit the solder beads to making contact with only the correct terminals 32, 43, etc., during solder reflow. Thus, bridging solder flows between adjacent solder beads 102, 104, etc., and 282, etc., with resulting short circuits and open circuits are prevented.

Figure 9:
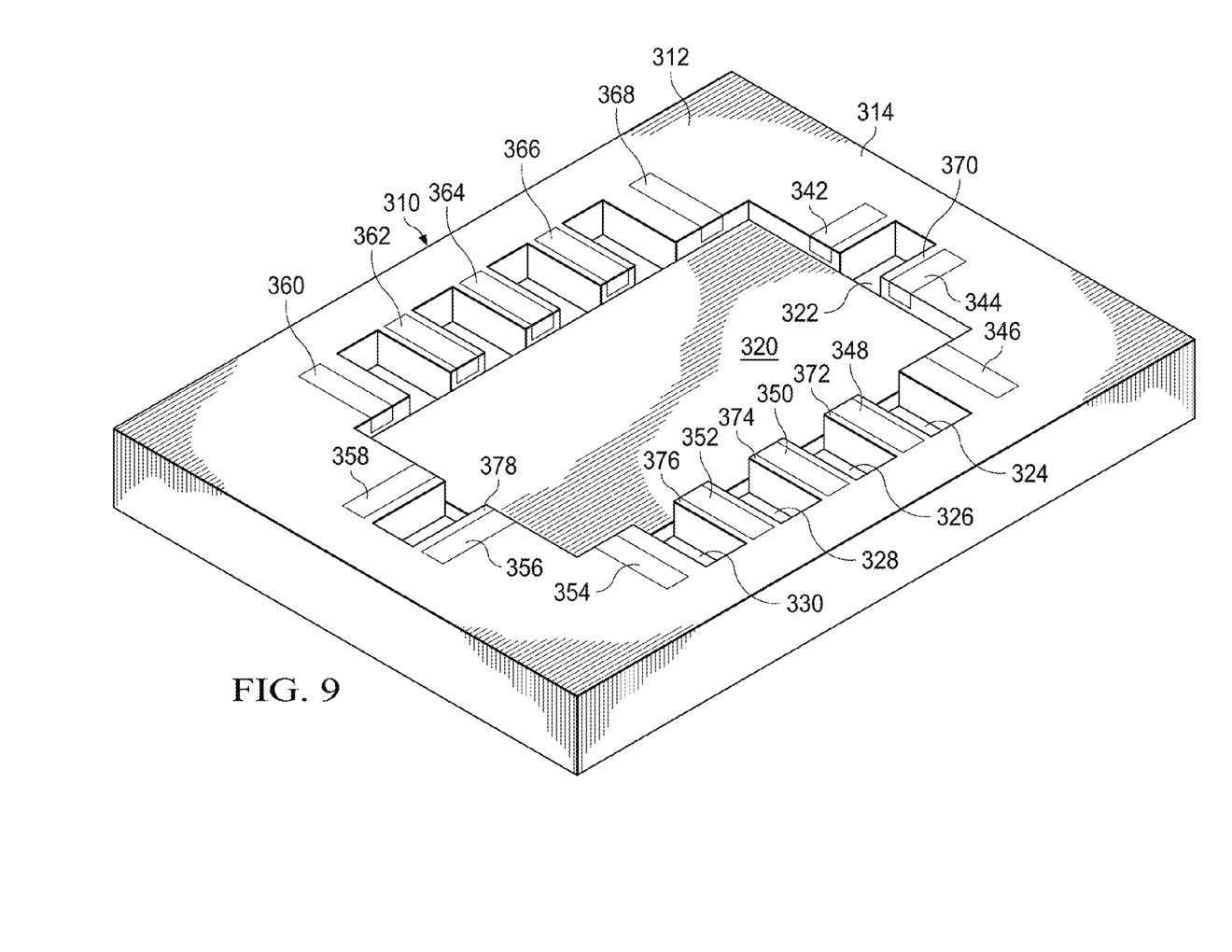
FIG. 9 is a schematic isometric view of another electrical substrate having a plurality of recessed portions thereon.
Figure 10:
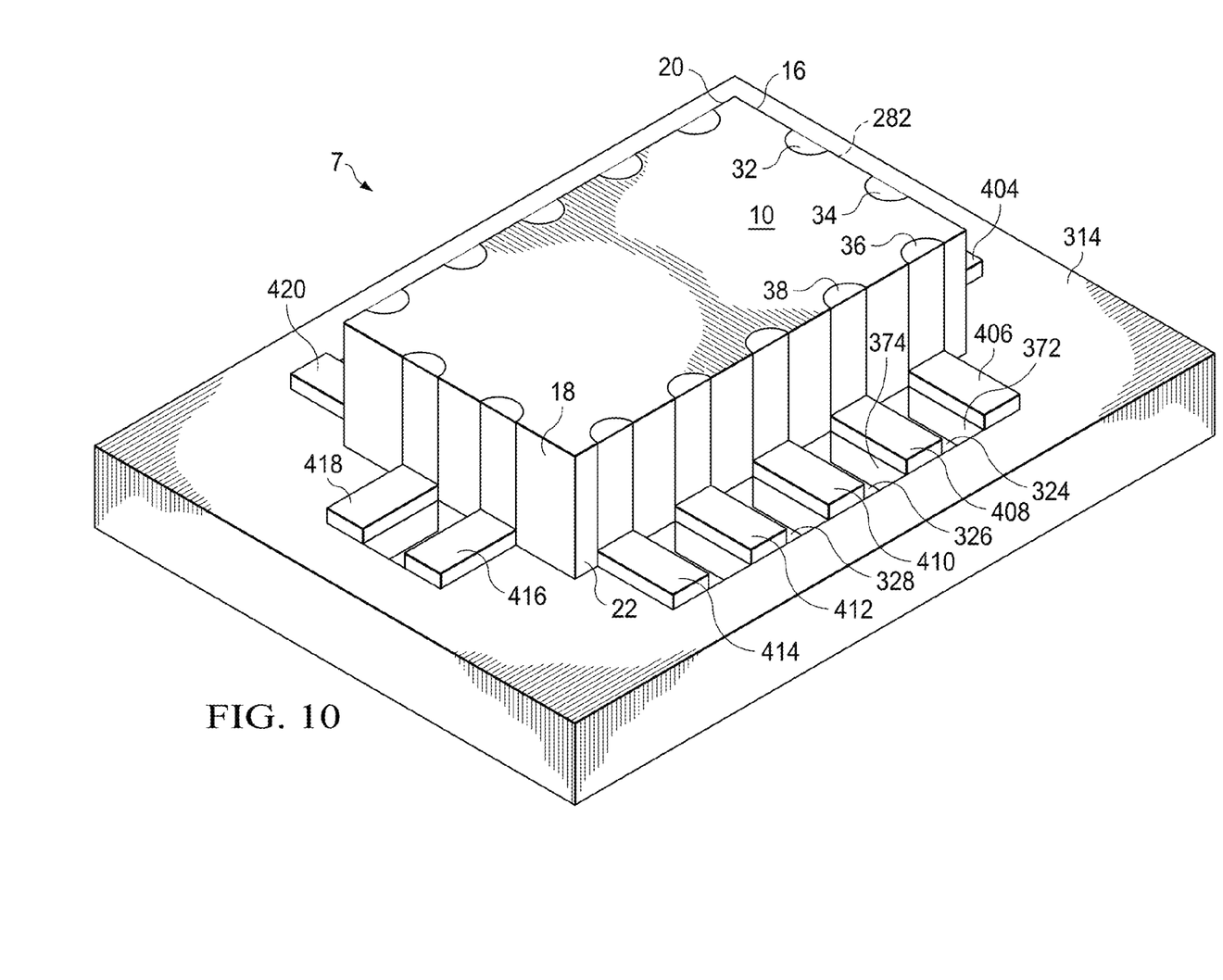
FIG. 10 is a schematic isometric view of the substrate of FIG. 9 with an IDC mounted thereon.

FIGS. 9 and 10 illustrate another IDC assembly 7. In this assembly 7 a substrate 310 has a top portion 312 with a flat top surface 314. A large central recessed portion 320 having substantially the same footprint as the IDC 10 is formed in the top portion 312. A plurality of smaller recessed portions or grooves 322, 324, 326, etc., extend laterally outwardly from the large central recessed portion 320. The grooves 322, 324, 326, etc., define a plurality of inwardly projecting fingers 370, 372, 374, etc. In one embodiment, the grooves 322, 324, 326, etc., are somewhat deeper than the central recessed portion 320, for example, 2-3 µm deeper. A contact pad 342, 344, 346, etc. is formed on each finger 370, etc. A solder bead strip 406, 408, etc., is formed on top of each contact pad 342, etc. As illustrate in FIG. 10, each finger, e.g. 372 and the associated contact pad (not visible in FIG. 10) and solder bead strip, e.g., 408 is aligned with a terminal, e.g. 38, of an IDC 10 that is placed in the central recessed portion 320. The IDC 10 may be substantially identical to the IDC 10 described above with reference to FIGS. 7 and 8. The side wall portions 16, 18, 20, 22 of the IDC 10 make abutting contact with two or more walls on the substrate that define the central recessed portion 320, thus placing the IDC 10 in proper linear and angular relationship with the substrate 310 and placing the terminals 32, 34, etc. of the IDC 10 in registration with corresponding contact pads 342, 344, etc., and solder bead strips 404, 406, etc. In this embodiment, as previously mentioned, the grooves 322, etc., that separate the solder bead strips 404 etc., are somewhat deeper than the central recessed portion 320. As such, the grooves 322, etc., serve as reservoirs that trap and retain and isolate any solder that might flow laterally from a solder bead strip 404 or that might be slightly laterally offset during solder paste application. Thus, in this structure, the grooves 322 etc., prevent short circuits associated with solder bead contact with more than one terminal or with an adjacent solder bead. The abutting contact between the vertical sidewalls of the central recessed portion and the sidewalls 16, 18, 20, 22 of the IDC 10 assure proper registration between the solder bead strips 404 etc., and the terminals 32, 34, etc., of the IDC 10. The dimensions of the central recessed portion 320 may be slightly larger than the footprint dimensions of the IDC 10 to allow the IDC 10 to be inserted easily into the recessed portion 320 and yet are not so large as to defeat close registration between terminals 32, 34, etc., and solder bead strips 404, etc. In one embodiment the length and width dimensions of the recessed portion 320 are about 5% to 10% larger than the length and width dimensions of the IDC 10, and the depth of the recessed portion 320 is about 30% of the height (thickness) of the IDC 10.

Figure 11:
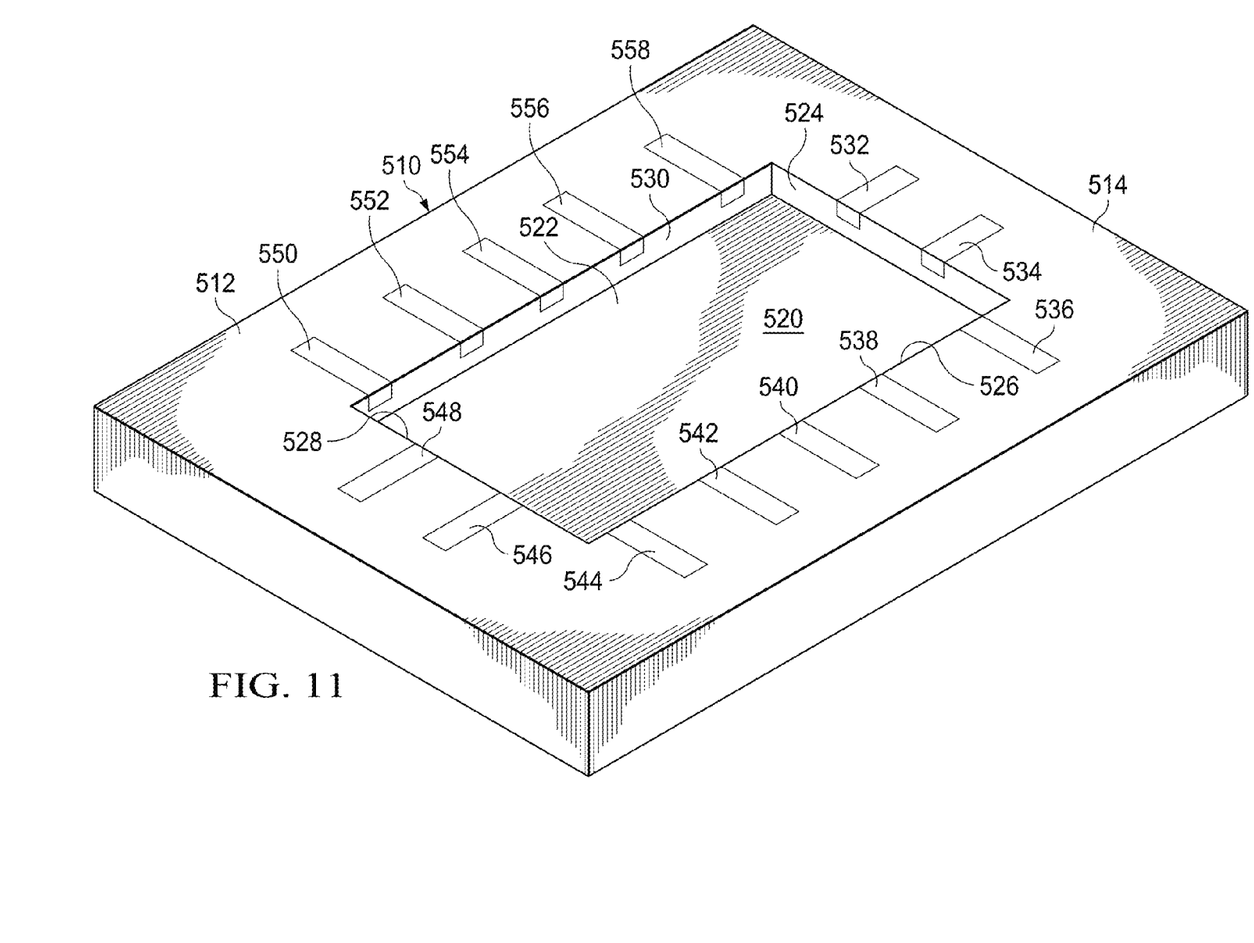
FIG. 11 is a schematic isometric view of an electrical substrate having a central recessed portion thereon.
Figure 12:
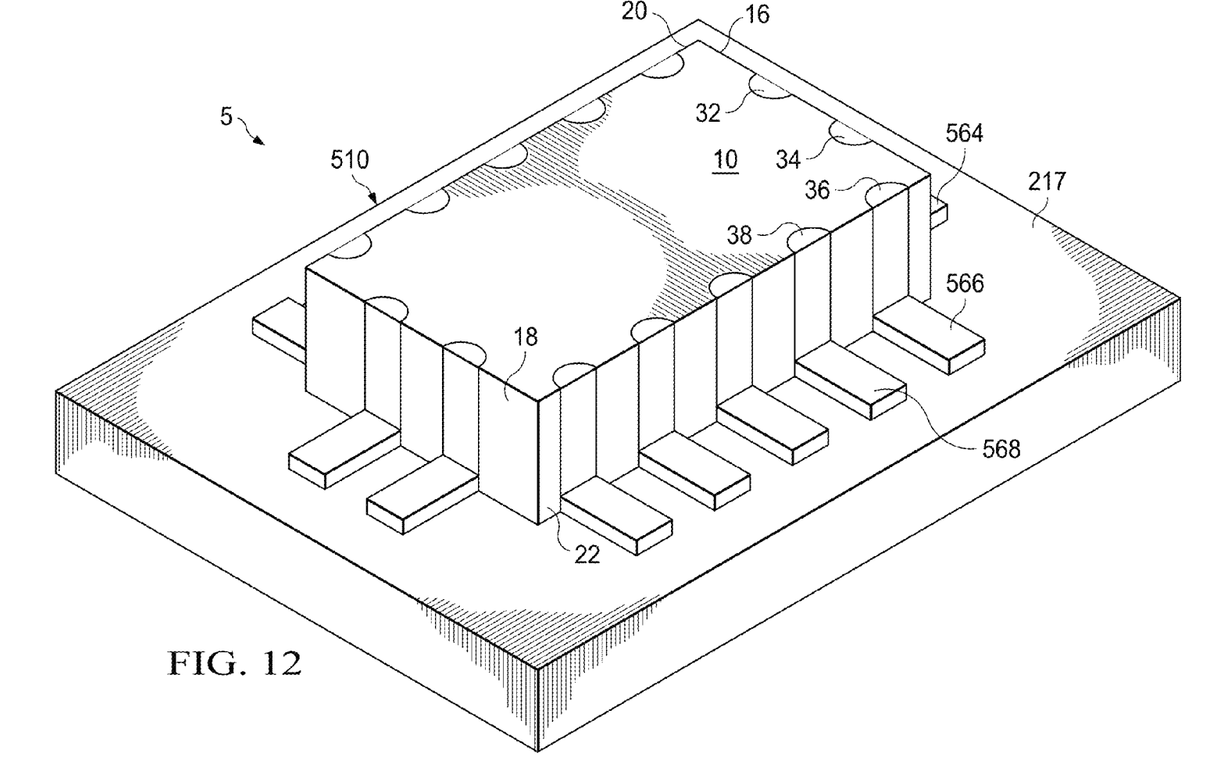
FIG. 12 is a schematic isometric view of the substrate of FIG. 11 with an IDC mounted thereon.

In yet another embodiment, as shown in FIGS. 11 and 12, and IDC assembly 5 includes an IDC 10, which may be identical to those of the previously described embodiments, and a substrate 510. The substrate 510 has a top portion 512 with a generally flat top surface 514. A large central recessed portion 520 is provided in the top portion of the substrate 510. This central recessed portion 520, unlike those of the previously described embodiments, does not have slots extending outwardly therefrom. Contact pads 532, 534, 536, etc. are provided at the top surface 514 of the substrate 510 at positions corresponding to the positions of the terminals 32, 34, 36, etc. on IDC 10. Solder bead strips 564, 566, 568, etc. are formed from solder paste strips that may be screen printed or otherwise provided on top of the contact pads, 532, etc. Vertical sidewalls 524, 526, 528, 530 that define the recessed portion 520 provide abutment surfaces that engage corresponding abutment surfaces provided by IDC sidewalls 16, 18, 20, 22 of the IDC 10 to properly angularly and linearly position the IDC 10 with the substrate 510. The terminals 32, 34, etc., on the IDC 10 are thus placed in registration with solder bead strips 564, 566, 568, etc. that are formed over the contact pads 532, 534, etc.

Figure 13:
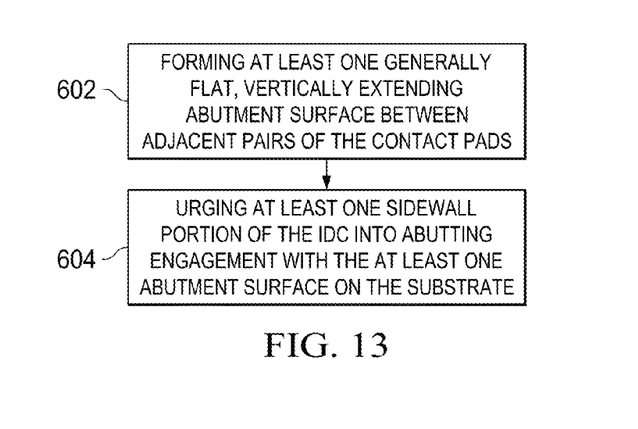
FIG. 13 is a flow diagram of a method of registering terminals on an IDC with contact pads on a substrate.

FIG. 13 is a flow diagram of a method of registering terminals on an IDC with contact pads on a substrate. The method includes, as shown at 602, forming at least one vertically extending abutment surface between adjacent pairs of the contact pads. The method further includes, as shown at 604, urging at least one sidewall portion of the IDC into abutting engagement with the at least one abutment surface on the substrate.

Figure 14:
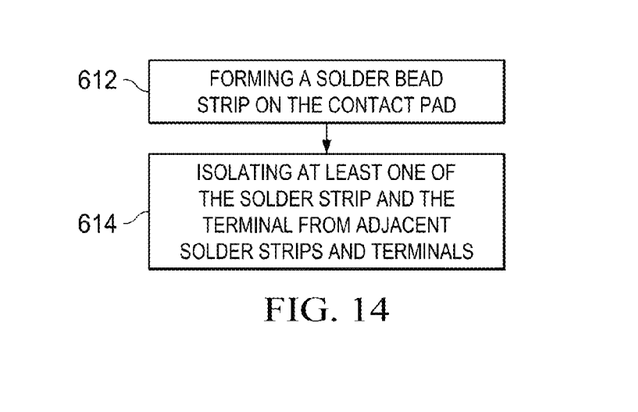
FIG. 14 is a flow diagram of a method of preventing solder that connects a terminal on an IDC with a contact pad on a substrate from causing short circuits between adjacent terminals.

FIG. 14 is a flow diagram of a method of preventing solder that connects a terminal on an IDC with a contact pad on a substrate from causing short circuits between adjacent terminals. The method includes forming a solder bead strip on the contact pad, as shown at 612. The method further includes, as shown at 614, isolating at least one of the solder strip and the terminal from adjacent solder strips and terminals.

While certain embodiments of an interdigitated chip capacitor assembly and methodologies associated therewith have been expressly disclosed herein in detail, various other embodiments of such assemblies and methodologies will be obvious to those skilled in the art after reading this disclosure. It is intended that that the appended claims be broadly construed so as to cover all such alternative embodiments except to the extent limited by the prior art.

What is claimed is:

1. A method of creating an interdigitated chip capacitor ("IDC") assembly comprising:
    forming at least one vertically extending nonconductive abutment surface between adjacent ones of the contact pads, each contact pad having a top;
    forming on the substrate top portion a plurality of grooves projecting outwardly from a central recess;
    urging at least one sidewall portion of the IDC into abutting engagement with the at least one abutment surface on a substrate;
    providing a plurality of solder paste strips on the top of the contact pads; and
    forming a plurality of solder bead strips from the plurality of solder paste strips.

2. The method of claim 1 wherein the forming at least one abutment surface comprises forming a plurality of abutment surfaces arranged in a predetermined pattern conforming to the shape of the IDC.

3. The method of claim 1 wherein the forming at least one abutment surface comprises forming at least two abutment surfaces that are both taller than a solder bead provided on a contact pad positioned between the two abutment surfaces.

4. The method of claim 1 wherein the forming at least one abutment surface comprises forming nonconductive dams between adjacent ones of said contact strips.

5. The method of claim 1 wherein the urging at least one sidewall portion of the IDC into abutting engagement with the at least one abutment surface comprises urging two sidewall portions of the IDC into abutting engagement with two abutment surfaces on the substrate.

6. The method of claim 1 wherein the plurality of solder paste strips on the top of the contact pads have been screen printed.

7. A method of preventing solder that connects a terminal on an interdigitated chip capacitor ("IDC") with a contact pad on a substrate from causing short circuits between adjacent terminals, said method comprising:
    forming a plurality of grooves extending laterally outwardly from a central recessed portion on the substrate;

the plurality of grooves defining a plurality of inwardly projecting fingers;

forming a plurality of contact pads on a respective plurality of fingers;

forming a solder bead on at least some of the plurality of contact pads; and isolating at least one solder bead from adjacent solder beads and adjacent terminals.

8. The method of claim 7 wherein the isolating comprises isolating at least one of the solder bead and the terminal with at least one generally vertical wall provided on the substrate.

9. The method of claim 8 wherein the isolating at least one of the solder bead and the terminal with at least one generally vertical wall on the substrate comprises placing the contact pad and the solder bead in a slot.

10. The method of claim 7 wherein the isolating at least one of the solder bead and the terminal comprises placing the contact pad and the solder bead on a raised portion between two slots.

11. The method of claim 8 wherein the isolating at least one of the solder bead and the terminal from adjacent solder beads and terminals comprises moving the sidewall of the IDC into abutting contact with the at least one generally vertical wall provided on the substrate.

12. The method of claim 7 wherein the solder bead extends higher than an upper surface of the substrate.

13. The method of claim 7 wherein the solder bead does not extend as high as an upper surface of the substrate.

* * * * *